United States Patent [19]

Foell et al.

[11] Patent Number: 4,563,976
[45] Date of Patent: Jan. 14, 1986

[54] DEVICE FOR MANUFACTURING LARGE-SURFACE, TAPE-SHAPED SILICON BODIES FOR SOLAR CELLS

[75] Inventors: Helmut Foell, Munich; Josef Grabmaier, Berg; Richard Falckenberg, Unterhaching, all of Fed. Rep. of Germany

[73] Assignee: Siemens Aktiengesellschaft, Berlin and Munich, Fed. Rep. of Germany

[21] Appl. No.: 512,733

[22] Filed: Jul. 11, 1983

[30] Foreign Application Priority Data

Aug. 23, 1982 [DE] Fed. Rep. of Germany ....... 3231326

[51] Int. Cl.[4] .......................... B05C 3/15; B05C 11/02
[52] U.S. Cl. ........................ 118/401; 118/405; 118/419; 118/429; 156/617 SP; 156/617 H; 422/249
[58] Field of Search .............. 422/246, 249; 156/617 SP, 608, 617 H, DIG. 88, DIG. 97, DIG. 98; 427/86; 118/401, 405, 419, 429

[56] References Cited

U.S. PATENT DOCUMENTS

| 600,250 | 3/1898 | Reese | 118/419 X |
| 2,673,549 | 3/1954 | Frucki | 118/401 |
| 2,928,212 | 3/1960 | Long | 156/DIG. 97 |
| 4,174,234 | 11/1979 | Lindmayer | 427/86 X |
| 4,226,834 | 10/1980 | Shudo et al. | 156/DIG. 97 |
| 4,233,338 | 11/1980 | Ricard et al. | 156/608 |
| 4,269,652 | 5/1981 | Yancey | 156/608 |
| 4,289,571 | 9/1981 | Jewett | 422/249 |
| 4,319,953 | 3/1982 | Grabmaier | 156/608 |
| 4,325,917 | 4/1982 | Pelts et al. | 156/608 |
| 4,329,195 | 5/1982 | Kudo | 156/DIG. 97 |
| 4,505,221 | 3/1985 | Falckenberg et al. | 118/401 X |

FOREIGN PATENT DOCUMENTS

| 2850805 | 6/1980 | Fed. Rep. of Germany . |
| 3010557 | 9/1981 | Fed. Rep. of Germany . |
| 2041781 | 9/1980 | United Kingdom ................ 422/246 |

OTHER PUBLICATIONS

NASA Tech. Brief, Winter 1977, Inexpensive Silicon Sheets for Solar Cells, Caltech/JPL, Pasadena, Calif. pp. 432-433.

Primary Examiner—Barry S. Richman
Assistant Examiner—Michael S. Gzybowski
Attorney, Agent, or Firm—Hill, Van Santen, Steadman & Simpson

[57] ABSTRACT

In an exemplary embodiment, tape-shaped silicon bodies for solar cells are formed by continuous coating of a carrier body having a mesh structure. A melt bath receives the silicon melt and has a floor part with capillary openings therein for supplying the melt, the capillary openings leading perpendicularly toward the exterior of the vat and proceeding parallel to one another, and wherein a channel for the guidance of the carrier body proceeding in a horizontal direction is disposed below the melt vat in the region of the capillary openings. The guide channel for the carrier body can also be disposed above a body with capillaries proceeding parallel in a vertical direction, the body being partially immersed in the vat containing the silicon melt for the purpose of supplying the melt via the capillaries. The devices enable continuous tape drawing from a silicon melt wherein convection currents are avoided in the melt.

4 Claims, 4 Drawing Figures

DEVICE FOR MANUFACTURING LARGE-SURFACE, TAPE-SHAPED SILICON BODIES FOR SOLAR CELLS

BACKGROUND OF THE INVENTION

The present invention relates to apparatus for manufacturing large-surface, tape-shaped silicon bodies for solar cells by means of coating a carrier body with molten silicon, said carrier body being resistant to the silicon melt but being moistenable by the melt and exhibiting a mesh structure, wherein a melt vat accepting the silicon melt and guide devices in the area thereof are provided, these ensuring that the carrier body to be coated is continuously brought into contact with the melt.

Such a device can be derived from the German OS No. 28 50 805. A carrier body comprised of a graphite mesh is thereby drawn tangentially across the surface of the silicon melt situated in the melt vat in a continuous method, whereby the carrier body is incorporated in the silicon tape after the crystallization process. A surface drawing rate of one meter squared per minute (1 m²/min) can be achieved with this method.

The convection currents occurring in the melt in the prior system present technical difficulties, these leading to considerable temperature fluctuations at the crystallization front and, thus, to fluctuations in the thickness of the silicon layer. It is also difficult to continuously and uniformly re-supply the silicon melt and, thus, to always keep the melt level at the same height, this likewise being a necessary precondition for a uniform coating of the carrier body.

A more uniform coating is achieved when, as disclosed in the German OS No. 30 10 557 Al, the coating is supplied relative to the drawing rate such that only a thin layer is formed in the meshes of the carrier body net comprised of graphite or graphitized silica glass threads due to the high surface tension of the molten silicon and the fact that the tape-shaped net is guided through a slit-shaped opening of a channel applied in the floor part of the melt vat and extending in the direction toward the melt surface, whereby the slit-like opening is matched to the dimensions of the tape-shaped net (thread thickness). The problem of re-supplying silicon into the melt vat is not yet satisfactorily resolved here.

SUMMARY OF THE INVENTION

The object underlying the invention resides in creating a drawing device for cheaply manufacturing silicon tapes for solar cells wherein a uniform coating given high throughput is guaranteed, i.e., in that
1. convection currents in the melt are avoided; and
2. a simple re-filling system can be applied.

This object is achieved by a device of the type initially cited either in that
(a) the melt vat exhibits capillary openings for the supply of the melt in the floor part of the vat, said openings leading vertically to the outside and proceeding parallel to each other, and
(b) a heatable channel for the guidance of the carrier body is disposed below the melt vat in the region of the capillary openings, said channel proceeding in a horizontal direction; or, in that
(a) the melt vat is coupled to a body comprised of a system of parallel capillaries extending in the vertical direction and
(b) a channel for the guidance of the carrier body to be coated is disposed above the capillary body in the area of the capillary openings filled with the silicon melt, said channel proceeding in a horizontal direction.

By means of employing the capillary body, the melt supply to the carrier body is, on the one hand, decoupled from the supply melt and, on the other hand, disruptions due to convection currents are avoided due to the low thickness of the melt in the crystallization area and due to the high heat capacity of the capillary body.

Further developments of the invention derive from the subclaims. Reference is now made to FIGS. 1 through 4 on the accompanying drawing sheets for explaining the inventive devices; and other objects, features and advantages will be apparent from this detailed disclosure and from the appended claims.

DETAILED DESCRIPTION

Figure 1:
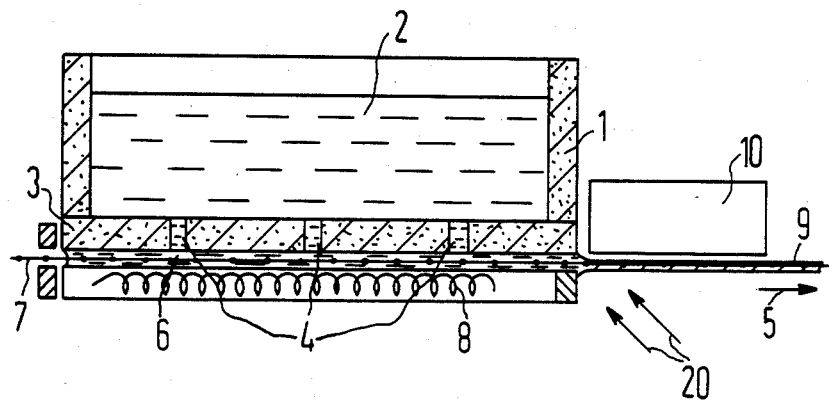
FIGS. 1 and 2 are schematic illustrations of drawing devices wherein the guide channel is situated below the melt vat (FIG. 1) and above the melt vat (FIG. 2)
Figure 2:
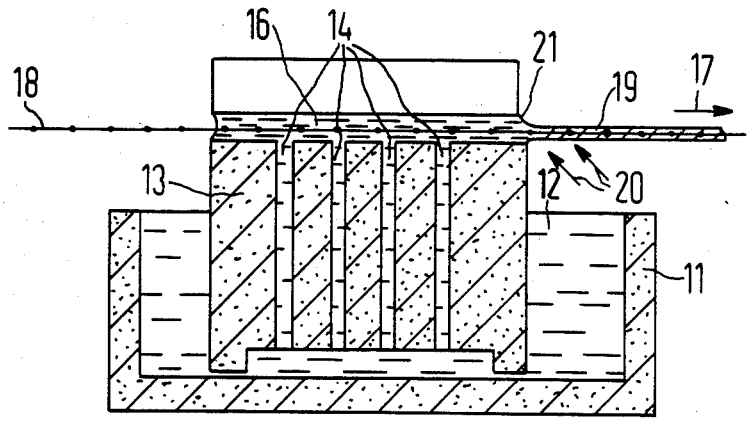
Figure 3:
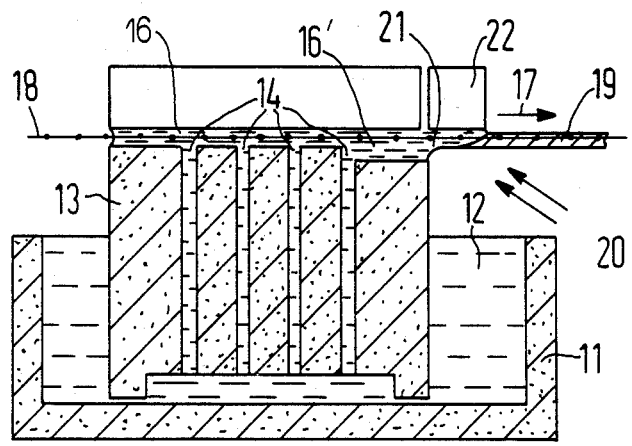
FIG. 3 shows an embodiment according to FIG. 2 with a specially designed discharge opening of the guide channel.

Illustration of the mechanism effecting the movement of the carrier body has been foregone in the illustration of the devices according to FIGS. 1 through 3 because it does not pertain to the essence of the invention.

FIG. 1: The molten silicon 2 situated in a melt vat 1 (consisting, for example, of graphite or silica glass) is replenished either continuously or at specific intervals by a simple re-supplying system (not illustrated) based on the measure of the silicon used by the coating process. The coating is supplied to the carrier body 7 consisting of a graphite net through capillary openings 4 situated in the floor part 3 of the melt vat 1 and leading vertically downward parallel to one another, said carrier body 7 being guided in a horizontal direction (v. arrow 5) in a channel 6 below the melt vat 1. The guide channel 6 is provided with a heating unit 8 so that the molten silicon 2 moistening the carrier body 7 does not crystallize into a silicon tape 9 in which the carrier body 7 is integrated until it has left the guide channel 6. An additional heater 10 can be disposed at the exit location at the height of the capillary openings 4 and a cooling device, for example, a blower (v. arrow 20) can be disposed below the carrier body, the crystallization process being thereby promoted.

FIG. 2: The molten silicon 12 situated in the melt vat 11 is supplied to a carrier body 18 consisting of a graphite net and proceeding in a horizontal direction (v. arrow 17) in a guide channel 16, being supplied by means of a body 13 of graphite having a system of capillaries 14 proceeding parallel to one another and extending in a vertical direction.

When the body 13 containing the capillaries 14 is partially immersed in the silicon melt 12, then the molten silicon rises into the capillaries 14, fills the guide channel 16 with molten silicon and coats the passing carrier body 18. The capillary body 13 can be heated by means of direct current in order to keep the silicon in its molten state (not illustrated). Likewise, the guide channel can also be heated. The coated carrier body (=silicon tape 19) can be cooled from below by a blower 20 when departing the guide channel 16 in order to promote the crystallization FIG. 3: An asymmetrical coating of the tape-shaped carrier body (18, 19) can be achieved in that the discharge opening 21 of the guide channel 16 is downwardly expanded at 16' and a heating device 22 is disposed in front of the opening 21 above the carrier body 19 coated with silicon, and below a cooling device, for example, a blower 20 is disposed. For the rest, the same reference symbols apply as in FIG. 2.

Figure 4:
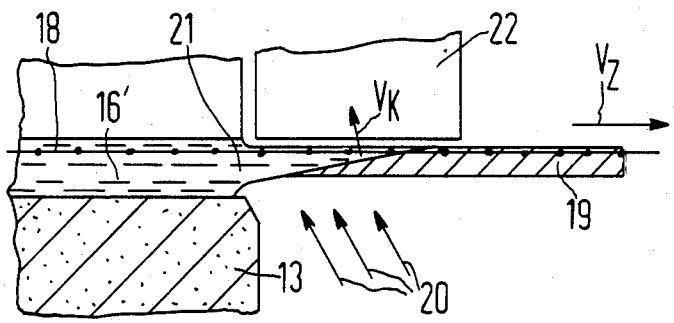
FIG. 4 is a diagrammatic sketch concerning the crystallization process according to FIG. 3.

As can be derived from FIG. 4, molten silicon necessarily first crystallizes with the drying rate $v_z$ at that side of the carrier body 18 facing the cooling means 20. Because of the temperature rise in the direction toward the heating means 22, the further crystallization then ensues in the direction toward the carrier body (18, 19) at the rate $v_K << v_Z$.

It will be apparent that many modifications and variations may be made without departing from the scope of the teachings and concepts of the present invention.

We claim as our invention:

1. In an apparatus for manufacturing large-surface, tape-shaped silicon bodies for solar cells by coating a carrier body with molten silicon, said carrier body having a mesh structure and being resistant to the silicon melt but being wettable by said melt, said apparatus having a melt vat accepting the silicon melt and guide devices for ensuring that the carrier body to be coated is continuously brought into contact with the melt, the improvement comprising:
   a. capillary body disposed in said melt vat having a system of parallel capillary passages extending in a vertical direction in the capillary body and terminating in a substantially horizontal top surface of said body for drawing melt from said vat to form a melt pool at said top surface; and
   said guide devices comprising a horizontal guide channel communicating with said capillary passages and completely filled by said melt pool for guiding the carrier body to be coated in a horizontal direction through said melt pool.

2. The apparatus of claim 1 wherein the improvement further comprises direct current means for heating said capillary body.

3. The apparatus of claim 1 wherein the improvement further comprises a downwardly expanded discharge opening in said guide channel, a heating device disposed adjacent to the discharge opening above the coated carrier body, and a cooling device disposed adjacent to the discharge opening below the coated carrier body.

4. The apparatus of claim 1 wherein the improvement further comprises means for heating said guide channel.

* * * * *